(12) United States Patent
Lee

(10) Patent No.: US 7,105,927 B2
(45) Date of Patent: Sep. 12, 2006

(54) STRUCTURE OF DUMMY PATTERN IN SEMICONDUCTOR DEVICE

(75) Inventor: Se Young Lee, Chungcheongbuk-do (KR)

(73) Assignee: Magnachip Semiconductor, Ltd., Chungcheongbuk-do (KR)

( * ) Notice: Subject to any disclaimer, the term of this patent is extended or adjusted under 35 U.S.C. 154(b) by 0 days.

(21) Appl. No.: 11/132,597

(22) Filed: May 19, 2005

(65) Prior Publication Data

US 2005/0263904 A1 Dec. 1, 2005

(30) Foreign Application Priority Data

May 28, 2004 (KR) .................. 10-2004-0038460

(51) Int. Cl.
| H01L 23/48 | (2006.01) |
| H01L 23/52 | (2006.01) |
| H01L 29/40 | (2006.01) |
| H01L 29/76 | (2006.01) |
| H01L 29/94 | (2006.01) |

(52) U.S. Cl. ............... 257/773; 257/48; 257/401; 257/496; 257/734; 257/758; 257/798

(58) Field of Classification Search .............. 257/48, 257/734, 773, 401, 496, 758, 798
See application file for complete search history.

(56) References Cited

U.S. PATENT DOCUMENTS

| 5,430,325 | A | * | 7/1995 | Sawada et al. ............. 257/618 |
| 5,714,784 | A | * | 2/1998 | Ker et al. ..................... 257/360 |
| 5,838,050 | A | * | 11/1998 | Ker et al. ..................... 257/401 |
| 5,911,110 | A | * | 6/1999 | Yu ................................ 438/424 |
| 6,171,976 | B1 | * | 1/2001 | Cheng .......................... 438/760 |
| 6,570,243 | B1 | * | 5/2003 | Hagihara ..................... 257/620 |
| 6,777,756 | B1 | * | 8/2004 | Ohguro ........................ 257/365 |
| 6,777,814 | B1 | * | 8/2004 | Iwasaki et al. .............. 257/778 |
| 6,782,512 | B1 | * | 8/2004 | Asakawa ........................ 716/1 |
| 2002/0019091 | A1 | * | 2/2002 | Kim ............................ 438/239 |
| 2003/0071263 | A1 | * | 4/2003 | Kouno et al. ................. 257/48 |
| 2003/0178647 | A1 | * | 9/2003 | Kawashima et al. ........ 257/200 |
| 2004/0080053 | A1 | * | 4/2004 | Wang et al. ................. 257/774 |
| 2004/0115925 | A1 | * | 6/2004 | Tseng et al. ................. 438/633 |
| 2004/0166660 | A1 | * | 8/2004 | Yamaguchi .................. 438/613 |
| 2005/0064634 | A1 | * | 3/2005 | Schmidt et al. ............. 438/183 |

FOREIGN PATENT DOCUMENTS

JP 2004281473 A * 10/2004

* cited by examiner

*Primary Examiner*—Ida M. Soward
(74) *Attorney, Agent, or Firm*—Marshall, Gerstein & Borun LLP

(57) ABSTRACT

Disclosed herein is a dummy pattern structure of a semiconductor device. The dummy pattern structure may include daughter dummy patterns respectively formed at places corresponding to vertexes of polygons in regions where metal wirings are not formed in an interlayer insulating film where metal wirings are formed, thus being arranged in the whole region while constituting a polygon shape, and mother dummy patterns respectively formed at places corresponding to the middles of the polygon, which is formed by the daughter dummy patterns. Generation of metal residues in a region where metal wirings are not formed when the metal wirings are formed by means of a damascene process are prevented. Also, a delamination phenomenon that interlayer insulating films are fallen apart can be prevented.

16 Claims, 3 Drawing Sheets

STRUCTURE OF DUMMY PATTERN IN SEMICONDUCTOR DEVICE

BACKGROUND

1. Field of the Invention

The present invention relates to the structure of a dummy pattern in a semiconductor device. More specifically, the present invention relates to the structure of a dummy pattern in a semiconductor device in which the structure of the dummy pattern formed in a region where a metal wiring is not formed when the metal wiring is formed by means of a damascene process is improved, thus preventing generation of metal residues and a delamination phenomenon that an interlayer insulating film is fallen apart.

2. Discussion of Related Art

As a semiconductor device becomes higher integrated, the line width of a metal wiring becomes gradually narrow and the density thereof is increased. Even with a higher integration level of a device, there is a need for a rapid operating speed for the device. Accordingly, a metal wiring is formed by using a material having good electrical properties, such as copper, as a metal wiring material by means of a damascene process.

If the damascene process is performed so as to use copper as the metal wiring, a plating process and a Chemical Mechanical Polishing (CMP) process are necessarily required. In this time, if the plating process is carried out with a region where the metal wiring is not formed being left as a blanket state, a step generated between the region where the metal wiring is not formed and a region where a metal wiring is formed. Thus, after the CMP process, metal residues are created in the region where the metal wiring is not formed. In particular, if an area of the region where the metal wiring is not formed is wide and a line width of the metal wiring in the region where the metal wiring is formed is great, a more serious problem can be caused. Furthermore, if a material, which contains carbon or has a porous low dielectric constant value (low-k), is used as an interlayer insulating film, a delamination phenomenon that the interlayer insulating film is fallen apart in the region where the metal wiring is not formed is generated. Accordingly, the yield of a device is lowered. In order to solve these problems, most semiconductor manufacturers form a dummy pattern in the region where the metal wiring is not formed. However, even if the dummy pattern is formed, generation of metal residues and the delamination phenomenon of the interlayer insulating film cannot be prevented. That is, if a dummy pattern is formed without considering the structure of the dummy pattern such as a distance between the dummy patterns and the density of the dummy patterns, metal plating is thickly formed in the region where the dummy pattern is formed than in the region where the metal wiring is formed. Consequently, there is a problem in that metal residues are created after a subsequent CMP process. More particularly, if an area where a dummy pattern is formed is wide, this problem will be more severe.

SUMMARY OF THE INVENTION

Accordingly, the present invention has been made in view of the above problems, and it is an object of the present invention to provide the structure of a dummy pattern in a semiconductor device in which not only generation of metal residues but also a delamination phenomenon that an interlayer insulating film is fallen apart can be prevented by improving the structure of the dummy pattern.

To achieve the above object, according to an aspect of the present invention, there is provided a dummy pattern structure of a semiconductor device, comprising: daughter dummy patterns respectively formed at places corresponding to vertexes of polygons in regions where metal wirings are not formed in an interlayer insulating film where metal wirings are formed, thus being arranged in the whole region while constituting a polygon shape, and mother dummy patterns respectively formed at places corresponding to the middles of the polygon, which is formed by the daughter dummy patterns.

The daughter dummy patterns and the mother dummy patterns are formed by the same process as a process of forming a metal wiring.

The daughter dummy patterns, the mother dummy patterns and the metal wiring are formed by means of a damascene process.

The daughter dummy patterns are preferably arranged in the form of one of a triangle, a square, a pentagon, a hexagon and an octagon, and the daughter dummy patterns are preferably arranged in the form of one of a triangle, a square, a pentagon, a hexagon and an octagon.

A distance between the daughter dummy patterns and between the daughter dummy pattern and the mother dummy pattern is 3 to 100.

Each of the daughter dummy patterns and the mother dummy patterns is formed in a variety of polygonal shapes, wherein the daughter dummy patterns and the mother dummy patterns are formed in the same polygon among the variety of the polygonal shapes, or have a shape in which the variety of the polygons are mixed. In each of the daughter dummy patterns and the mother dummy patterns, the length of one side of the polygon is 3 to 100 μm. An area of each of the daughter dummy patterns and the mother dummy patterns is 9 to 10000 μm$^2$.

The daughter dummy patterns and the mother dummy patterns have the polygon of the same area, the mother dummy patterns have an area wider than that of the daughter dummy pattern, or the daughter dummy patterns have an area wider than that of the mother dummy pattern.

The mother dummy patterns and the daughter dummy patterns are formed to have the density of 10 to 50% of the entire region where the mother dummy patterns and the daughter dummy patterns are formed.

The mother dummy patterns and the daughter dummy patterns are formed to have the same density as the density of the metal wiring in the region where the metal wiring is formed, or the density 15% higher than the density of the metal wiring in the region where the metal wiring is formed.

An area of the region where the mother dummy patterns and the daughter dummy patterns are formed is 250000 μm$^2$ or less. If the area of a region where the mother dummy patterns and the daughter dummy patterns are formed is 250000 μm$^2$ or more, pad patterns of an area wider than that of the dummy patterns are further formed. The pad patterns are formed to have the density of 10 to 40%.

DETAILED DESCRIPTION OF PREFERRED EMBODIMENTS

Figure 1A:
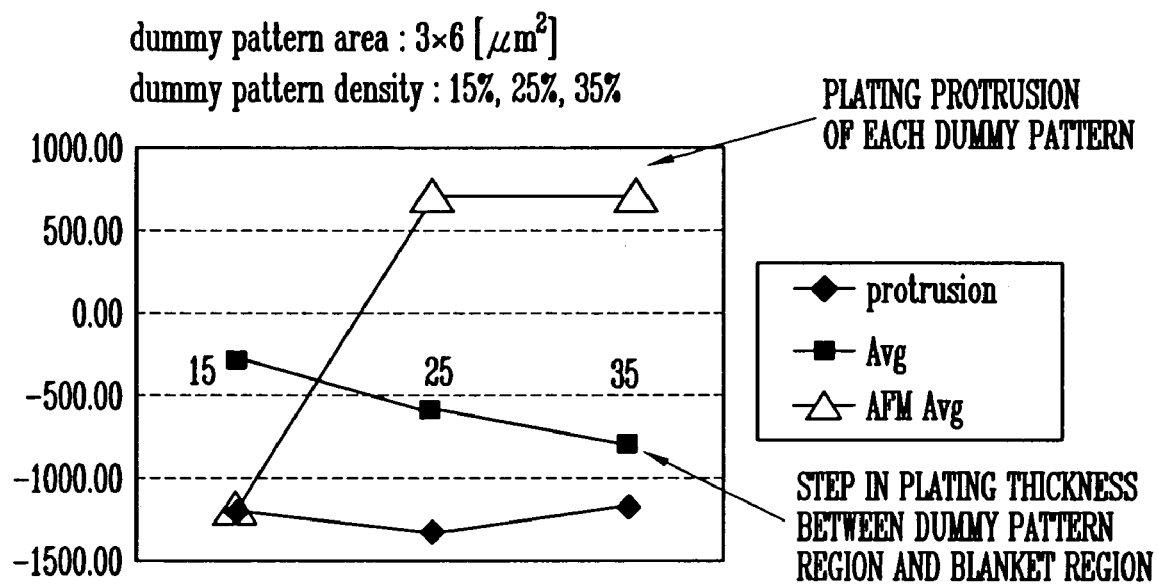
FIGS. 1a to 1c show experimental data for a plating protrusion tendency depending on the density and area of a dummy pattern.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

Figure 1B:
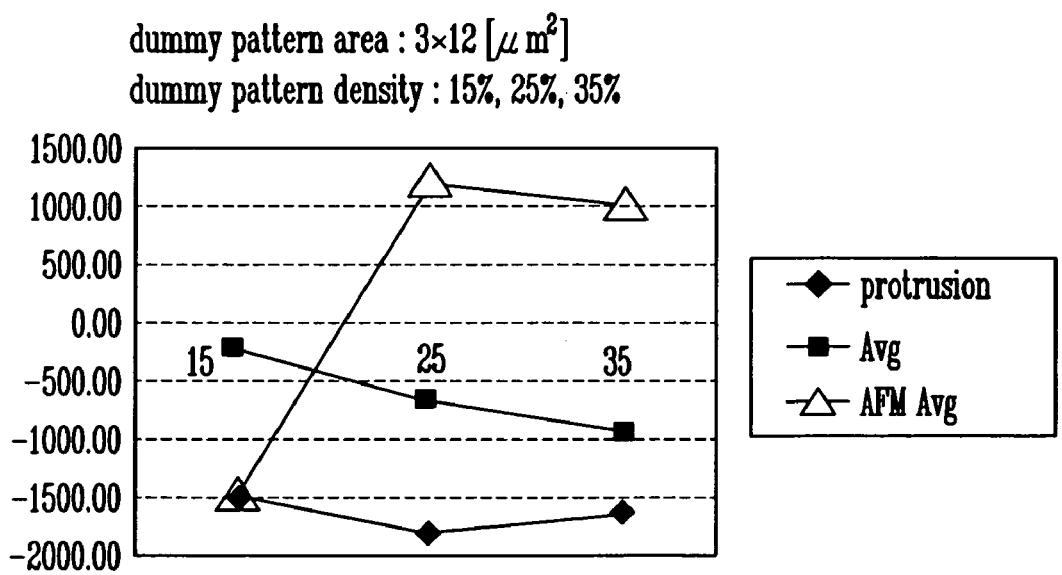
Figure 1C:
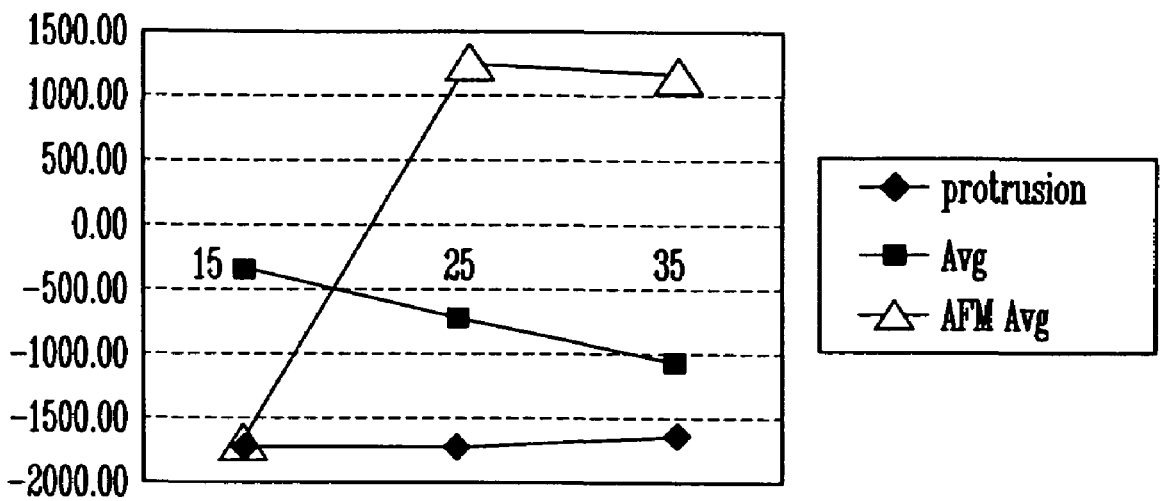

FIGS. 1a to 1c show experimental data for a plating protrusion tendency depending on the density and area of a dummy pattern. FIG. 1a shows an experimental result that a dummy pattern of a rectangular form, which has width 3 μm×length 6 μm, is formed using copper, and the density of the dummy pattern is 15%, 25% and 35%. FIG. 1b shows an experimental result that a dummy pattern of a rectangular form, which has width 3 μm×length 12 μm, is formed using copper, and the density of the dummy pattern is 15%, 25% and 35%. FIG. 1c shows an experimental result that a dummy pattern of a rectangular form, which has width 3 μm×length 18 μm, is formed using copper, and the density of the dummy pattern is 15%, 25% and 35%.

From the experimental data shown in FIGS. 1a to 1c, it can be seen that a plating thickness of a dummy pattern formed by a plating process increases as the density rises, and then becomes a saturation state. Furthermore, as a result of comparison between an average plating thickness of the region where the dummy pattern is formed, and that of a blanket region (region where the dummy pattern is not formed), it was found that as the density of the dummy pattern increases, a plating thickness in the region where the dummy pattern is formed becomes smaller than those in the blanket region. Accordingly, it can be seen that a plating protrusion phenomenon does not occur when the dummy patterns are located far apart (i.e., when the density is low), but an average plating thickness compared with the blanket region is smaller as the density of the dummy pattern increases. If the density of the dummy pattern is increased while the distance between the dummy patterns in the region where the dummy patterns are formed becomes far apart based on this property, a plating thickness can be lowered and generation of metal residues in the region where the dummy patterns are formed after the CMP process can be prevented accordingly.

Figure 2:
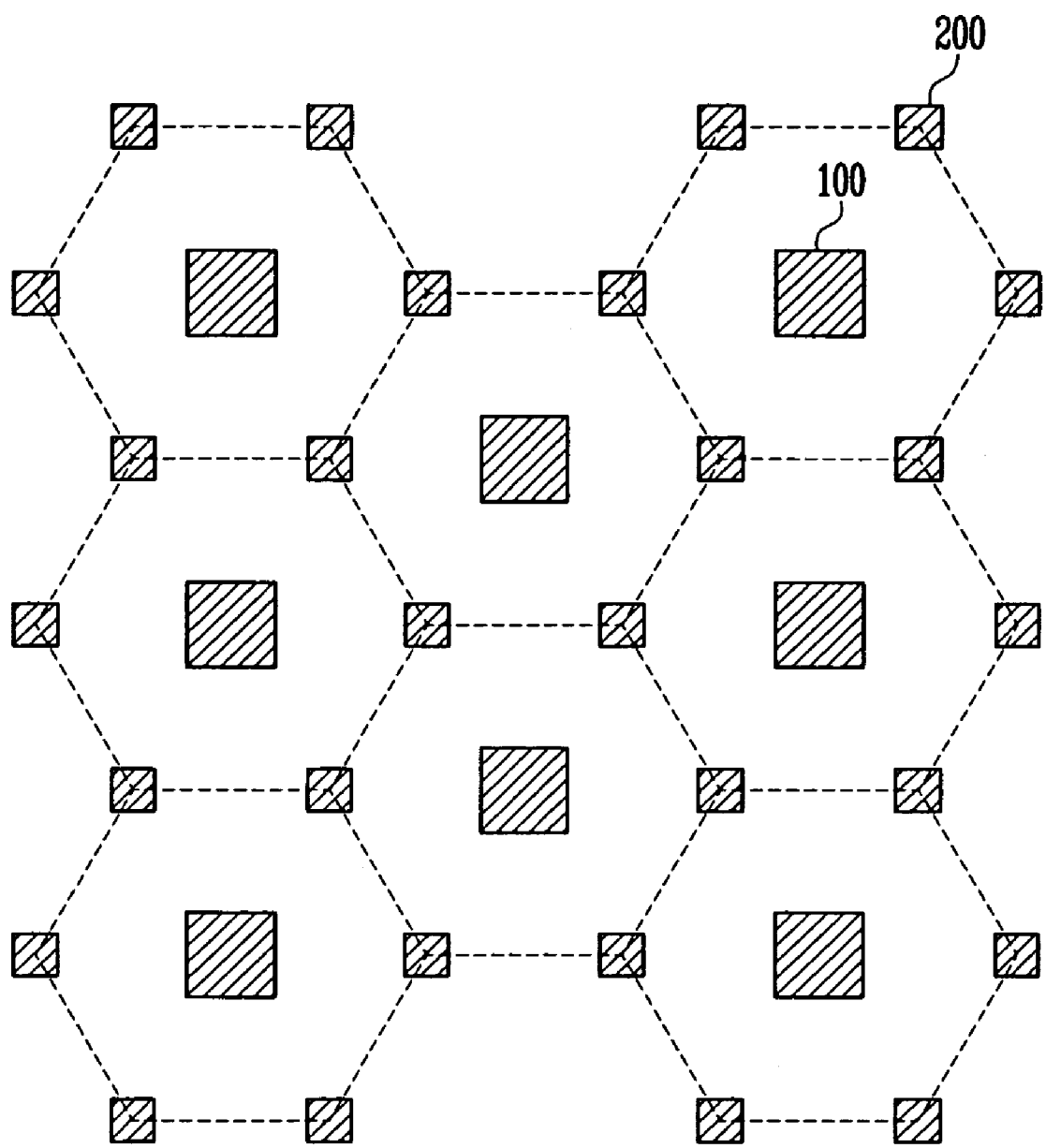
FIG. 2 is a plan view illustrating the structure of dummy patterns in a semiconductor device according to an embodiment of the present invention.

FIG. 2 is a plan view illustrating the structure of dummy patterns in a semiconductor device according to an embodiment of the present invention. From FIG. 2, it can be seen that the dummy patterns have a structure in which the density of the dummy patterns is increased, while making the distance between the dummy patterns far apart based on the above-described experiments.

Before the dummy pattern structure of the present invention is described with reference to FIG. 2, a process of forming a metal wiring by means of a damascene process will be first described. A semiconductor substrate on which a series of processes before a metal wiring formation process are performed is first provided. An interlayer insulating film is formed on the entire surface of the semiconductor substrate. A damascene pattern having a via contact hole and a trench is then formed by means of a damascene process. A metal such as copper is plated by means of a plating method. The plated metal is polished by means of a CMP process to form a metal wiring within the damascene pattern.

The dummy pattern structure shown in FIG. 2 according to the present invention has a plurality of mother dummy patterns 100 and a plurality of daughter dummy patterns 200 properly arranged in an interlayer insulating film of a region where the metal wiring is not formed by means of the same process as the above-described metal wiring formation process. That is, the dummy patterns 100 and 200 constituting the dummy pattern structure comply with the metal wiring formation process in terms of a process. In their arrangement, however, the density of dummy patterns 100 and 200 in the entire region where the dummy pattern is formed is increased while the distance between the dummy patterns 100 and 200 becomes far apart.

The dummy pattern structure composed of the mother dummy patterns 100 and the daughter dummy patterns 200 will now be described in detail with reference to FIG. 2.

In the structure of the dummy pattern according to the present invention, the mother dummy patterns 100 and the daughter dummy patterns 200 are formed in the region where the metal wirings are not formed during the process of forming the metal wiring by means of the damascene process. The daughter dummy patterns 200 are respectively formed at places corresponding to vertexes of a polygon. These daughter dummy patterns 200 are arranged over the entire regions where the metal wirings are not formed while constituting a polygon. The mother dummy patterns 100 are respectively formed at places corresponding to the middles of the polygons which are formed by the daughter dummy patterns 200.

In the above, the daughter dummy patterns 200 may be arranged in a variety of polygonal shapes such as a triangle, a square, a pentagon, a hexagon and an octagon. In order to increase the density of the dummy patterns while making a distance between the dummy patterns far apart as far as possible, it is preferred that the daughter dummy patterns 200 are arranged in the form of a regular square, a regular pentagon, a regular hexagon and a regular octagon. Furthermore, the mother dummy patterns 100 are formed in the middles of the polygons. This is also for increasing the density of the dummy pattern while making a distance between the dummy patterns far apart as far as possible.

The distance between the daughter dummy patterns 200 or the distance between the daughter dummy patterns 200 and the mother dummy patterns 100 is 3 to 100 μm so that a plating protrusion phenomenon is prevented and the density of the dummy patterns 100 and 200 is high in the entire region.

Each of the mother dummy pattern 100 and the daughter dummy pattern 200 has various polygonal shapes such as a triangle, a square, a pentagon, a hexagon and an octagon. All the dummy patterns 100 and 200 may have the same polygonal shape or a shape in which various polygons are mixed. In each of the dummy patterns 100 and 200, the length of one side of the polygon is 3 μm by maximum, preferably 3 to 100 μm and an area of the polygon is 9 μm$^2$ or more by maximum, preferably 9 to 10000 μm$^2$. Since an internal space area of the polygon, which is formed by the daughter dummy patterns 200, is wider than that of other places, it will be advantageous that the mother dummy pattern 100 formed in the middle of the polygon has an area, which is at least 1.5 times wider than that of the daughter dummy pattern 200, in terms of a higher density of the dummy pattern. However, the present invention is not limited thereto, but an area of all the dummy patterns 100 and 200 can be made same or an area of the daughter dummy pattern 200 can be wider than that of the mother dummy pattern 100.

It is preferred that the density of all the dummy patterns 100 and 200 formed under the above condition is 10 to 50% of the whole region where the dummy patterns are formed. If the density of the dummy pattern is 10% or less, it is insufficient to reduce the step between the region where the metal wiring is formed and the region where the metal wiring is not formed. It is thus difficult to accomplish the original purpose of forming the dummy pattern. If the density of the dummy pattern is 50% or more, it is difficult to accomplish the object of the present invention, for preventing a plating protrusion phenomenon by making the distance between the dummy patterns far apart.

The density of all the dummy patterns 100 and 200 formed under the above condition is preferably the same as that of the metal wiring in the region where the metal wiring is formed or keeps high within 15%. The reason why the density keeps within 15% is because a plating thickness of the dummy pattern becomes similar to or lower than that of the metal wiring.

The area of the region where the dummy pattern is formed is preferably 250000 μm² or less. This is because if the area of the region where the dummy pattern is formed is too wide, there is a high possibility that metal residues may be generated after a CMP process. If the area where the dummy pattern is formed is 250000 μm² or more, other patterns having a wider pattern than that of the dummy patterns 100 and 200, e.g., pad patterns (not shown) having a size of 50×50 μm or more are formed to have the density of 10 to 40% compared with a total area. This is for preventing generation of metal residues because there is a possibility that the metal residues may occur after a CMP process if only the patterns of the same shape occupy a wide area. In this time, the reason why the density of the pad patterns is limited to 10 to 40% is because the density of metal wirings in a semiconductor device is 10 to 40%.

As described above, generation of metal residues in the dummy pattern region after a subsequent CMP process is prevented by lowering a plating thickness in the plating process among the process of forming the dummy patterns 100 and 200. Furthermore, the reason why the daughter dummy patterns 200 are arranged in various polygonal shapes and the mother dummy patterns 100 are formed in the middles of the polygons are for inducing distribution of a polishing pressure in a CMP process as well as increase in the density of the dummy patterns while making the distance between the dummy patterns far apart. That is, all the dummy patterns 100 and 200 serve as a pole in the CMP process to distribute a polishing pressure. Furthermore, all the dummy patterns 100 and 200, specially, the daughter dummy patterns 200 serves to prohibit propagation of delamination where an interlayer insulating film is fallen apart.

As described above, the present invention is advantageous in that it can lower a thickness of a metal plated in a region where dummy patterns are formed. It is possible to prevent a phenomenon that copper is projected high after copper is plated in each of the dummy patterns. Generation of metal residue in a region where dummy patterns are formed after a CMP process can be prevented and generation of delamination of an interlayer insulating film can be also prevented. Accordingly, the present invention is advantageous in that it can implement a device of high reliability and enhances the yield.

What is claimed is:

1. A dummy pattern structure of a semiconductor device, comprising:
   first dummy patterns formed between metal wirings in an interlayer insulating film where metal wirings are formed, wherein the first dummy patterns respectively formed at places corresponding to vertexes of polygons thus being arranged with constituting a polygon shape; and
   second dummy patterns respectively formed at places corresponding to the middles of the polygon which is formed by the first dummy patterns.

2. The dummy pattern structure as claimed in claim 1, wherein the first dummy patterns and the second dummy patterns are formed by the same process as a process of forming a metal wiring.

3. The dummy pattern structure as claimed in claim 1, wherein the first dummy patterns, the second dummy patterns and the metal wiring are formed by means of a damascene process.

4. The dummy pattern structure as claimed in claim 1, wherein the first dummy patterns are arranged in the form of one of a triangle, a pentagon, a hexagon and an octagon.

5. The dummy pattern structure as claimed in claim 1, wherein the first dummy patterns are arranged in the form of one of a regular triangle, a regular pentagon, a regular hexagon and a regular octagon.

6. The dummy pattern structure as claimed in claim 1, wherein a distance between the first dummy patterns is 3 to 100 μm.

7. The dummy pattern structure as claimed in claim 1, wherein a distance between the first dummy pattern and the second dummy pattern is 3 to 100 μm.

8. The dummy pattern structure as claimed in claim 1, wherein the second dummy patterns and the first dummy patterns are formed to have the density of 10 to 50% of the entire region where the second dummy patterns and the first dummy patterns are formed.

9. The dummy pattern structure as claimed in claim 1, wherein the second dummy patterns and the first dummy patterns are formed to have the same density as the density of the metal wiring in the region where the metal wiring is formed, or the density 15% higher than the density of the metal wiring in the region where the metal wiring is formed.

10. The dummy pattern structure as claimed in claim 1, wherein each of the first dummy patterns and the second dummy patterns is formed in a variety of polygonal shapes, wherein the first dummy patterns and the second dummy patterns are formed in the same polygon among the variety of the polygonal shapes, or have a shape in which the variety of the polygons are mixed.

11. The dummy pattern structure as claimed in claim 10, wherein in each of the first dummy patterns and the second dummy patterns, the length of one side of the polygon is 3 to 100 μm.

12. The dummy pattern structure as claimed in claim 10, wherein an area of each of the first dummy patterns and the second dummy patterns is 9 to 10000 μm².

13. The dummy pattern structure as claimed in claim 10, wherein the first dummy patterns and the second dummy patterns have the polygon of the same area, the second dummy patterns have an area wider than that of the first dummy pattern, or the first dummy patterns have an area wider than that of the second dummy pattern.

14. The dummy pattern structure as claimed in claim 1, wherein an area of the region where the second dummy patterns and the first dummy patterns are formed is 250000 μm$^2$ or less.

15. The dummy pattern structure as claimed in claim 14, wherein if the area of a region where the second dummy patterns and the first dummy patterns are formed is 250000 μm$^2$ or more, pad patterns of an area wider than that of the dummy patterns are further formed.

16. The dummy pattern structure as claimed in claim 15, wherein the pad patterns are formed to have the density of 10 to 40%.

* * * * *